United States Patent [19]

Idaka et al.

[11] Patent Number: 5,057,694
[45] Date of Patent: Oct. 15, 1991

[54] OPTOELECTRONIC RELAY CIRCUIT HAVING CHARGING PATH FORMED BY A SWITCHING TRANSISTOR AND A RECTIFYING DIODE

[75] Inventors: Yukio Idaka, Nara; Shuichiroh Yamaguchi, Hirakata; Takeshi Matsumoto, Neyagawa, all of Japan

[73] Assignee: Matsushita Electric Works, Ltd., Osaka, Japan

[21] Appl. No.: 489,016

[22] Filed: Mar. 6, 1990

[30] Foreign Application Priority Data

Mar. 15, 1989 [JP] Japan .................................. 1-64164
Jun. 27, 1989 [JP] Japan ................................. 1-166325

[51] Int. Cl.$^5$ ............................................ G02B 27/00
[52] U.S. Cl. ..................................... 250/551; 307/311
[58] Field of Search ......................... 250/551; 307/311

[56] References Cited

U.S. PATENT DOCUMENTS

| | | | |
|---|---|---|---|
| 4,390,790 | 6/1983 | Rodriguez | 250/551 |
| 4,777,387 | 10/1988 | Collins | 307/311 |
| 4,801,822 | 1/1989 | Idaka et al. | 307/311 |
| 4,912,335 | 3/1990 | Ehalt et al. | 307/311 |
| 4,931,656 | 6/1990 | Ehalt et al. | 307/311 |

FOREIGN PATENT DOCUMENTS 1-33228 3/1989 Japan .

*Primary Examiner*—David C. Nelms
*Assistant Examiner*—Que T. Le
*Attorney, Agent, or Firm*—Burns, Doane, Swecker & Mathis

[57] ABSTRACT

A semiconductor relay circuit includes an output FET connected to a diode array. The diode array generates a photovoltaic output in response to a light signal from a light emitting element. Across the drain and gate of the FET is a series circuit of a semiconductor device and a rectifier is connected, the switching transistor is being made conductive upon receipt at the diode array of the light signal and forms a charge current path for an accumulated charge across the gate and source of the FET. The rectifier restrains a photocurrent from reversely flowing between the drain and gate of the FET. Turning-on and turning-off operations of the relay circuit can be thereby made both achievable at a higher speed, and the reverse flow of the photocurrent upon the conduction of the output FET can be prevented from occurring.

4 Claims, 2 Drawing Sheets

OPTOELECTRONIC RELAY CIRCUIT HAVING CHARGING PATH FORMED BY A SWITCHING TRANSISTOR AND A RECTIFYING DIODE

BACKGROUND OF THE INVENTION

This invention relates to semiconductor relay circuits and, more particularly, to an isolated semiconductor relay circuit. Isolation is provided by an arrangement of a circuit for converting a light signal into an electric signal by means of an array of photovoltaic diodes optically coupled to light emitting means, such as a light emitting diode, that converts an input signal into the light signal, and for driving an output field-effect transistor (which shall be simply referred to as "FET" hereinafter) by means of the electric signal into which the light signal is converted.

1. Field of the Invention

The semiconductor relay circuit of the kind referred to can be effectively utilized in, for example, a system of transmitting and controlling electric signals in metering and measuring devices and equipment.

2. Description of the Related Art

For the semiconductor circuit of the kind referred to, there has been suggested in, for example, U.S. Pat. No. 4,390,790 of E.T. Rodriguez a circuit in which a MOSFET is series connected in to a photovoltaic diode array optically coupled to a light emitting diode. A normally ON type junction FET is connected between the gate and source of this MOSFET, and a further photovoltaic diode array is connected through a resistor across the gate and source of the junction FET. In this U.S. patent, the MOSFET is prevented from being kept in intermediate state by arranging the normally ON type junction FET to be driven by another diode array, so as to achieve a high speed operation to some extent. Since the circuit arrangement combines the junction FET with another diode array, on the other hand, a problem arises that the diode arrays generally require a larger chip size. This deteriorates optical transmission efficiency and lowers the operation speed. When the output FET turns completely ON and the voltage across the drain and source becomes substantially zero, the current from the photovoltaic diode array is likely to flow across the drain and source of the output FET, so that the high speed operation can be attained only on such rare occasions that the output FET has a considerably high ON resistance and its drain voltage has such a higher level than the gate voltage as, normally, about 5V or more, which has been troublesome in that the normal operation range is thereby restricted.

In Japanese Utility Model Application Laid-Open Publication No. 64-33228 of Y. Nozaki et al, discloses a measure for speeding up the operation of MOSFET by connecting a phototransistor through a controlled-part power source across the drain and gate of the MOSFET and supplying a current from such power source through the phototransistor conducting to the gate of the MOSFET. According to this measure, however, a higher speed operation may be attained upon the turning-on but the speeding-up of the turning-off operation is still deficient due to the lack of any discharging control circuit across the gate and source of MOSFET. This leaves the problem unsolved in that the reverse flowing of the photocurrent between the gate and drain of MOSFET cannot be restrained and the normal operation range is thereby limited, for the same reason as in the foregoing known arrangement.

According to an earlier invention by the same inventors as in the present case, as disclosed in U.S. Pat. No. 4,801,822, there is provided a semiconductor circuit, in which a MOSFET is connected to a photovoltaic diode array optically coupled to a light emitting element. A depletion-mode driving FET is connected between the gate and source of this MOSFET, and a parallel circuit of a resistor and a constant voltage conduction element is connected across the gate and source of the driving FET, so that the constant voltage conduction element will be made conductive upon application of a voltage higher than that at a threshold level of the depletion mode driving FET, and an output FET will be charged across the gate and source and discharged across the drain and gate of an output FET by means of a conduction current upon the conduction of the element. While this circuit arrangement may attain a sufficiently satisfactory higher speed turning-off, it is still deficient in attaining the higher speed operation upon the turning-on.

SUMMARY OF THE INVENTION

A primary object of the present invention is, therefore, to provide a semiconductor relay circuit which attains high speed circuit operation by shortening required time for raising a voltage across the gate and source of the output FET, and which can relatively broaden the normal operation range of the circuit.

According to the present invention, this object can be realized by a semiconductor relay circuit comprising a light emitting element which generates a light signal, an array of diodes optically coupled to the light emitting element to generate a photovoltaic output upon receipt of the light signal, an output FET connected to the photovoltaic diode array for being caused to vary from a first impedance state to a second impedance state by the photovoltaic output applied across the gate and source of the FET, and means connected between the gate and source of the FET for controlling the operation thereof, wherein a series circuit of a semiconductor means and a rectifying means is connected between the drain and the gate of the output FET, the semiconductor means being turned into a low impedance state so as to form a charging path for an accumulated charge across the gate and source of the output FET when the diode array receives the light signal, and the rectifying means preventing any reverse flow of a photocurrent from occurring across the gate and drain of the output FET when a voltage across the drain and source of the FET becomes substantially zero.

In the semiconductor circuit according to the present invention arranged as in the above, in addition to the speeding up of the turning-off of the output FET, the charging path formed with respect to the gate and source upon the turning-on elevates remarkably the charging speed so as to effectively realize the speeding-up, and the rectifying means prevents the photocurrent generated by the photovoltaic diodes from reversely flowing across the gate and drain of the output FET even when the voltage across the drain and source of the output FET becomes substantially zero, whereby the circuit is made free of any circuit restriction taking into account such reverse flowing so as to secure an excellent range of normal operation.

Other objects and advantages of the present invention shall be made clear in the following description of the invention detailed with reference to preferred embodiments shown in accompanying drawings.

While the present invention shall now be described with reference to the embodiments shown in the accompanying drawings, it should be appreciated that the intention is not to limit the invention only to these embodiments but rather to include all modifications, alterations and equivalent arrangements possible within the scope of appended claims.

DETAILED DESCRIPTION OF THE PREFERRED EMBODIMENTS

Figure 1:
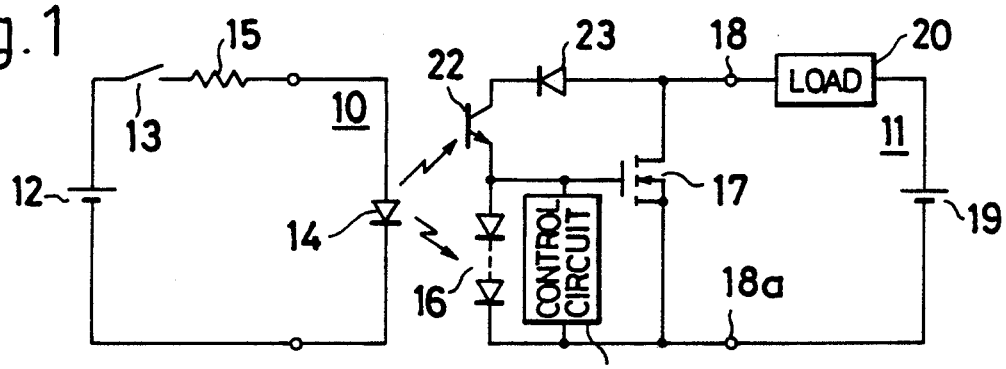
FIG. 1 is a circuit diagram showing an embodiment of the semiconductor relay circuit according to the present invention.

Referring to FIG. 1 showing an embodiment of the semiconductor relay circuit according to the present invention, the circuit comprises generally a relay input circuit 10, and a relay output circuit 11 optically coupled to the relay input circuit 10 while maintaining an isolation state therefrom. The relay input circuit 10 includes an electric power source 12, a relay switch 13 connected to the source 12 for transmitting an input signal, and a light emitting diode 14 connected through a resistor 15 to the relay switch 13 for generating a light signal in response to the input signal.

In the relay output circuit 11, an array of diodes 16 is included to be optically coupled to the light emitting diode 14 in the input circuit 10, for generating a photovoltaic output with the light signal received from the light emitting diode 14. This photovoltaic diode array 16 is connected to the gate and source of, preferably, an output MOSFET 17 which is desirably of N-channel type of enhancement mode and functions to turn from a first impedance state to a second impedance state with an application of the photovoltaic output from the diode array 16 across the gate and source, while the output FET 17 is connected at the drain and source through a pair of output terminals 18 and 18a to a series circuit of a power source 19 and load 20 so as to be at positive potential on the drain side with respect to the source side, for controlling the load 20 in accordance with the impedance state of the output FET 17.

Across the gate and source of the output FET 17, further, such a control circuit 21 that will form a discharge path is connected, while this circuit 21 may be, for example, an FET of a depletion mode or the like, which turns its state between a high impedance state and a low impedance state in response to the presence or absence of the photovoltaic output of the diode array 16. Further, across the drain and gate of the output FET 17, a series circuit of a phototransistor 22 and diode 23 is connected. In this case, the phototransistor 22 is also optically coupled to the light emitting diode 14 in the relay input circuit 10 in the same manner as the diode array 16, so that the phototransistor 22 will also receive the light signal from the light emitting diode 14 concurrently to be turned to the low impedance state. Upon this turning of the phototransistor 22 to the low impedance state, there will be formed a charging path for an accumulated charge across the gate and source of the output FET 17 so that required time for voltage rise across the gate and source of the output FET 17 will be remarkably shortened, and the high speed operation particularly upon turning-on of the output FET 17 and eventually the relay output circuit 11 can be promoted. In this case, the turning-off operation can be speeded up by the control circuit 21, and the high speed operation of the entire circuit can be realized. At the same time, the diode 23 is effective to restrain the photocurrent from the diode array 16 from flowing across the gate and drain of the output FET 17 at the time when the voltage across the drain and source of the output FET 17 becomes substantially zero, that is, when this FET is turned substantially to its complete conduction state, whereby the gate voltage of the output FET is made not to be lowered and a normal operation as a relay of the entire circuit can be assured.

Figure 2:
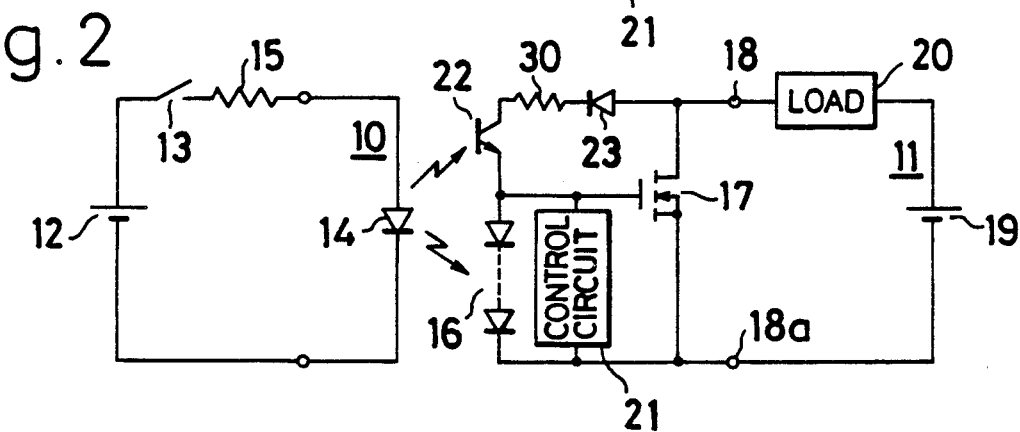
FIG. 2 is a circuit diagram showing another embodiment in which a resistor means is connected in series with respect to the rectifier means in the circuit of FIG. 1.
Figure 3:
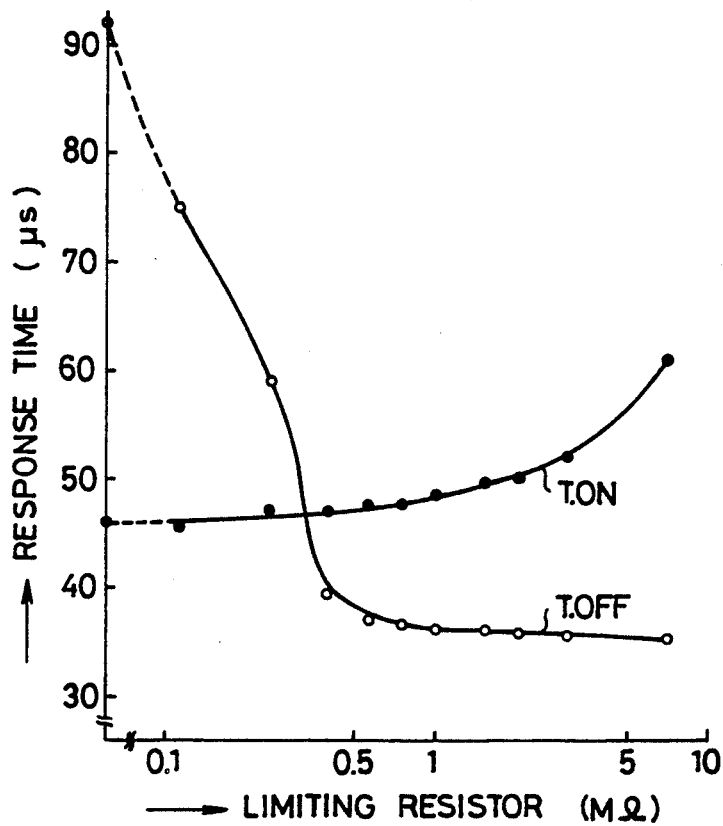
FIG. 3 is a diagram showing the relationship between the resistance value of the resistor means and the response time in the embodiment of FIG. 2.

Referring next to FIG. 2, there is shown a further improved working aspect of the semiconductor relay circuit of FIG. 1, in which aspect a limiting resistor 30 is inserted between the phototransistor 22 and the diode 23 in the circuit of FIG. 1. Response time of the output FET 17 in this arrangement has been measured with the value of this limiting resistor 30 varied, and such result as shown in FIG. 3 has been obtained. While the value of the limiting resistor 30 may properly be selected in accordance with characteristics of other circuit elements, it should be appreciated that, in this example of FIG. 3 where the value of the limiting resistor 30 is made in a range of 0.5 to 1.0 MΩ, a stable response time can be attained in such that the response time upon the turning on shown by a curve T.on has been about 48 μs and the response time upon the turning-off shown by a curve T.off has been about 36 μs. This is for the reason that, even when the turning-off time of the speeding-up semiconductor means 22 has become longer than turning-on time of the control circuit 21, the limiting resistor is arranged to restrict the current flowing into the gate from the drain of the output FET upon the turning-off so as not to disturb a fall of gate potential of the output FET. In the embodiment of FIG. 2, other circuit elements are substantially the same as those in FIG. 1, and the same reference numerals as in FIG. 1 is used also in FIG. 2.

While in the semiconductor relay circuit of FIGS. 1 and 2 the phototransistor 22 has been used as an element forming a positive charging path for the charge across the gate and source of the output FET 17, some other photosensitive elements, such as photothyristor, photodiode and the like which cause a current to flow in response to the light signal from the light emitting diode 14 may be commonly employed.

Figure 4:
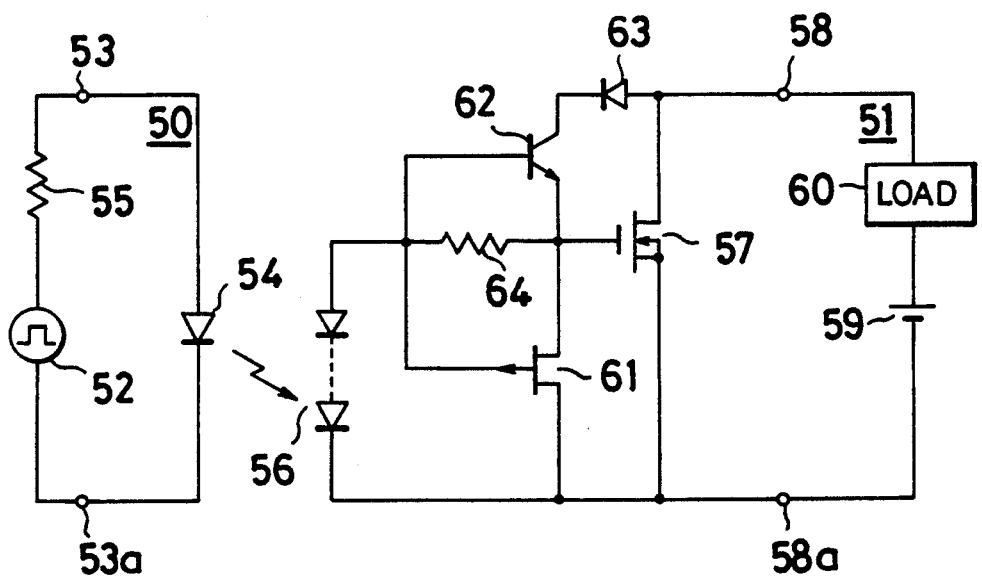
FIG. 4 shows in a circuit diagram a further embodiment of the semiconductor relay circuit according to the present invention.

Referring now to FIG. 4, a further embodiment of the semiconductor relay circuit according to the present invention is shown, which circuit generally comprises a relay input circuit 50 and a relay output circuit 51 optically coupled to the input circuit 50 while maintaining the isolation state therefrom. The relay input circuit 50 comprises a power source 52 to which connected through relay terminals 53 and 53a is a light emitting diode 54, and a resistor 55 is inserted between the power source 52 and one of the terminals 53 and 53a, so that a light signal will be transmitted out of the light emitting diode 54 in response to an input signal to the terminals 53 and 53a.

The relay output circuit 51 comprises a diode array 56 optically coupled to the light emitting diode 54 in the relay input circuit 50, so that a photovoltaic output will be generated by this diode array 56 in response to a light signal from the light emitting diode 54. An output transistor, preferably of MOSFET 57 is connected at its gate and source to the photovoltaic diode array 56, while this output FET 57 should desirably be of an N-channel type of enhancement mode, which functions to turn from a first impedance state to a second impedance state with an application of the photovoltaic output from the diode array 56 across the gate and source of the FET 57. Across the drain and source of the output FET 57, further, a series circuit of a power source 59 and load 60 is connected through a pair of output terminals 58 and 58a so that the drain side will be at the positive potential with respect to the source side, and the load 60 is controlled in accordance with the impedance state of the output FET 57.

Across the gate and source of the output FET 57, on the other hand, a controlling FET 61 which will form a discharge path is connected, while this FET should preferably be of a depletion mode, so as to turn its state between a high impedance state and a low impedance state depending on the presence and absence of the photovoltaic output of the diode array 56. Across the drain and gate of the output FET 57, further, a series circuit of an NPN transistor 62 and diode 63 is connected, and this NPN transistor 62 is connected at its base to a positive pole side of the diode array 56, while a resistor 64 is inserted between the gate of the output FET 57 and the positive pole side of the diode array 56.

In the embodiment of FIG. 4, the photovoltaic output generated at the diode array 56 with the input light signal, in particular, is provided through the source and drain of the controlling FET 61 to the resistor 64 and, as a voltage across this resistor 64 exceeds a threshold level, the controlling FET 61 turns to the high impedance state, so that a charge will be carried out across the gate and source of the output FET 57. companying this charging, a voltage generated at the resistor 64 is applied across the base and emitter of the NPN transistor 62 to be normally biased, and a conduction state is attained across the collector and emitter of the NPN transistor 62. Therefore, in the same manner as in the embodiment of FIG. 1, a charging path for the accumulated charge across the gate and source of the output FET 57 is formed through the NPN transistor 62, whereby the voltage rise across the gate and source of the output FET 57 is made to be abrupt so that the turning-on of the relay output circuit 51 can be speeded up. When the voltage across the drain and source of the output FET 57 reaches substantially zero, the photocurrent from the diode array 56 becomes likely to reversely flow between the gate and drain of the output FET 57, but this reverse flow is prevented by means of the diode 63. When on the other hand the light signal to the diode array 56 ceases and the diode array 56 stops the generation of the photovoltaic output, the NPN transistor 62 is reversely biased across the base and emitter by the voltage across the gate and source of the output FET 57, so as to be turned non-conductive. At the same time, the voltage across the gate and source of the controlling FET 61 falls to render this FET 61 to be turned to the low impedance state, an accumulated charge across the output FET is rapidly discharged with the controlling FET 61 made as a discharge path, and a high speed turning-off of the relay output circuit 51 can be thus realized. Accordingly, the present embodiment is also effective to speed up the operation of the semiconductor relay circuit. In the present instance, the NPN transistor may be replaced by an N-channel MOSFET, with the same level of effect expectable.

Figure 5:
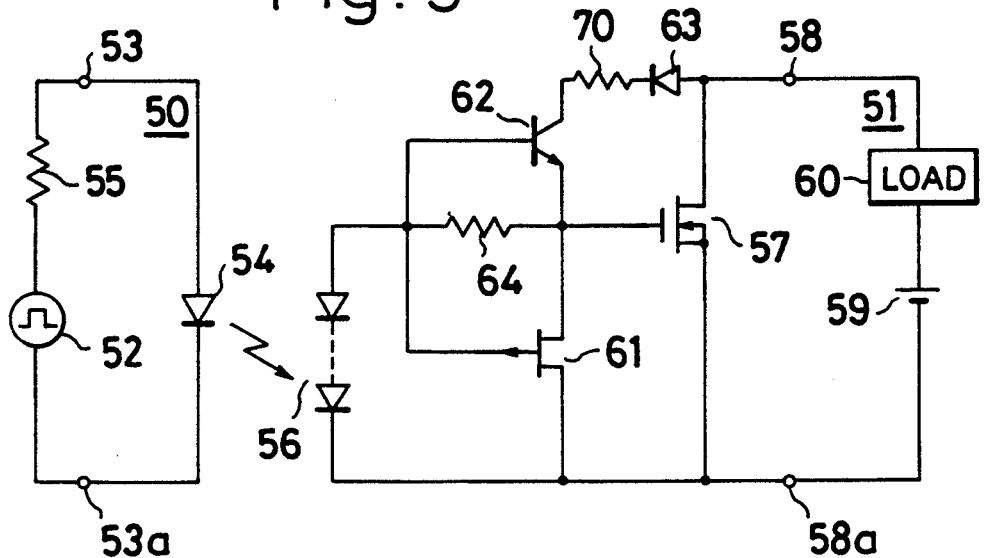
FIG. 5 is a diagram showing still another embodiment in which a resistor means is connected in series with respect to the rectifier means in the circuit of FIG. 4.

As shown in FIG. 5, further, a limiting resistor 70 is inserted between the NPN transistor 62 and the diode 63 in the semiconductor relay circuit of FIG. 4, in which event, too, substantially the same level of the stabilization of the response time as in the foregoing aspect of FIG. 2 as well as the retention of the normal operation range can be realized.

What is claimed is:

1. A semiconductor relay circuit comprising a light emitting means for generating a light signal, a diode array optically coupled to said light emitting means for generating a photovoltaic output in response to said light signal received, an output FET connected to said diode array for turning from a first impedance state to a second impedance state with an application of said photovoltaic output across a gate and a source of said output FET, an operation control means connected across the gate and source of said output FET, and a series circuit including a switching transistor and a rectifying diode connected across a drain and gate of said output FET, said switching transistor being turned to a low impedance state so as to form a charging path for an accumulated charge across the gate and source of said output FET when said diode array receives said light signal, and said rectifying diode preventing an reverse flow of a photocurrent across the gate and drain of said output FET when a voltage across the drain and source of said output FET becomes substantially zero.

2. The circuit according to claim 1 wherein said operation controlling means includes a controlling FET of a depletion mode.

3. The circuit according to claim 1 wherein a resistor is connected in series with said switching transistor and diode of said series circuit.

4. The circuit according to claim 1 wherein said operation controlling means includes a controlling FET of a depletion mode.

* * * * *